United States Patent [19]
Kierse

[11] Patent Number: 5,541,446
[45] Date of Patent: Jul. 30, 1996

[54] INTEGRATED CIRCUIT PACKAGE WITH IMPROVED HEAT DISSIPATION

[75] Inventor: Oliver J. Kierse, Clare County, Ireland

[73] Assignee: Analog Devices, Inc., Norwood, Mass.

[21] Appl. No.: 534,095

[22] Filed: Sep. 26, 1995

Related U.S. Application Data

[63] Continuation of Ser. No. 297,489, Aug. 29, 1994, abandoned.

[51] Int. Cl.⁶ .................................................. H01L 23/495
[52] U.S. Cl. ........................ 257/666; 257/676; 257/672
[58] Field of Search ................................. 257/676, 675, 257/666, 668, 789, 795, 714, 677, 787, 672, 692, 694, 695, 670

[56] References Cited

U.S. PATENT DOCUMENTS

| | | | |
|---|---|---|---|
| 4,943,843 | 7/1990 | Okinaga et al. | 257/666 |
| 4,987,474 | 1/1991 | Yasuhara et al. | 257/666 |
| 4,989,068 | 1/1991 | Yasuhara et al. | 257/677 |
| 5,146,310 | 9/1992 | Bayan et al. | 357/70 |

FOREIGN PATENT DOCUMENTS

| | | | |
|---|---|---|---|
| 1033939 | 2/1989 | Japan | 257/666 |
| 2310954 | 5/1989 | Japan | H01L 23/50 |
| 2-134854 | 5/1990 | Japan | 257/676 |
| 2-153557 | 6/1990 | Japan | |

*Primary Examiner*—Sara W. Crane
*Assistant Examiner*—Jhihan Clark
*Attorney, Agent, or Firm*—Koppel & Jacobs

[57] ABSTRACT

A leadframe that exhibits improved thermal dissipation and that can be incorporated into standard integrated circuit (IC) packages is provided by widening the inner lead portions with respect to the outer lead portions and extending them along a major surface of the IC. In the preferred embodiment, the wide inner lead portions cover at least 80 percent of the IC surface and also support the IC, eliminating the need for a leadframe paddle. The wide inner lead portions are more efficient at conducting heat away from the IC than prior "standard" width inner lead portions because of the increased thermal contact area between them and the IC. Heat from the IC is conducted to the outside of the package via the leads and into the circuit board on which the IC package is mounted. Added thermal dissipation is achieved by making the inner portion of a ground lead wider than the inner portion of any other lead. In addition, existing IC package designs that utilize the present leadframe structure can accomodate larger ICs than before because the present leadframe structure has no leadframe paddle to limit the IC size.

28 Claims, 3 Drawing Sheets

INTEGRATED CIRCUIT PACKAGE WITH IMPROVED HEAT DISSIPATION

This is a continuation of application Ser. No. 08/297,489, filed on Aug. 29, 1994, abandoned.

BACKGROUND OF THE INVENTION

1. Field of the Invention

The present invention relates to the housing and protection of integrated circuit chips. More specifically, the present invention relates to a leadframe structure that offers enhanced thermal dissipation for integrated circuit chips.

2. Description of the Related Art

Modern integrated circuits (ICs) require protection from self-heating effects to operate reliably. One of the methods by which ICs are cooled is heat conduction through the leadframe. The leadframe typically consists of a metallic paddle on which the IC is mounted and lead fingers for providing electrically conductive paths from the bonding pads of the IC to external elements, such as circuit boards.

An example of a prior leadframe is illustrated in FIG. 1. The IC 10 is typically attached to a leadframe paddle 12. Electrically conductive lead fingers 14 are electrically connected to the IC 10 with wire bonds 16 and serve to provide electrically conductive paths from the IC 10 to external elements (not shown). The leadframe is typically encapsulated in a moulding compound 18. The external widths of the lead fingers 14 are typically standardized according to the type of package. For example, 8-lead dual in-line plastic (DIP) and 8-lead small outline integrated circuit (SOIC) packages have outer lead finger portions that are between approximately 0.33 and 0.51 mm wide.

The heat conduction paths are along extensions 20 of the leadframe paddle 12 and through the moulding compound 18, which typically has poor thermal conductivity when compared to the lead fingers (which are typically made of copper). Although the lead fingers 14 are generally excellent heat conductors, they contribute relatively little to the thermal dissipation because the distance and moulding compound between them and the paddle 12 lowers the thermal conductivity.

In addition to the heat dissipation limitations, the size of the IC 10 that this type of leadframe can accomodate is limited by the size of the leadframe paddle 12.

As IC fabrication technology advances, more power generating elements are incorporated into single ICs, creating a need for mounting packages with increased thermal dissipation properties. One prior leadframe design, described in U.S. Pat. No. 5,146,310 by Bayan et al., improves thermal dissipation by connecting the paddle to four thermally conductive pins and also by increasing the surface area of the leadframe paddle. The paddle pins allow the paddle to be connected to external heat sinks, such as a ground plane on a circuit board. Although the Bayan leadframe design increases thermal dissipation over standard leadframes, the pin count is increased by up to four relative to a standard package. In order to incorporate the Bayan design into standard package designs, such as 8-lead DIP or 8-lead SOIC packages, the package dimensions must be increased by up to 50 percent to accommodate the additional paddle pins. As a result, these packages must be redesigned to accommodate the Bayan leadframe structure.

Another leadframe structure, described in Japanese Patent Application No. 2-310954 by Isao Sasahara, increases thermal dissipation by placing the inner ends of the lead fingers in close proximity to the leadframe paddle and branching the outer ends of each lead finger, so that a portion of each lead finger is attached to a thermally conductive sheet positioned on top of the IC package. Although the Sasahara structure improves thermal dissipation over standard leadframe structures, additional tooling is required to trim and form the lead fingers after the leadframe has been encapsulated in the moulding compound, and additional manufacturing steps are required to apply the thermally conductive sheet to the top of the IC package.

A third leadframe structure, described in U.S. Pat. No. 4,943,843 by Okinaga et al., extends some of the lead fingers underneath the IC so that they are better anchored to the moulding compound that typically encapsulates the leadframe and IC. A side benefit of this design is increased thermal dissipation via the lead fingers that extend underneath the IC. However, an even higher level of heat transfer is desirable.

SUMMARY OF THE INVENTION

In view of the limitations of prior leadframe structures, the present invention provides a leadframe that exhibits high thermal dissipation and that can be incorporated in standard IC package designs.

High thermal dissipation is achieved by widening the inner lead portions with respect to the outer lead portions and extending them along a major surface of the IC. In the preferred embodiment, the wide inner lead portions cover at least 80 percent of the IC surface and also support the IC, eliminating the need for a leadframe paddle. The wide inner lead portions are more efficient in conducting heat away from the IC than prior "standard" width inner lead portions because of the increased thermal contact area between them and the IC. The heat conducted to the inner lead portions is conducted to the outside of the package via the leads and into the circuit board upon which the IC package is mounted.

In a second embodiment, the inner portion of the ground lead is made wider than the other inner lead portions. The ground lead is typically connected to a ground plane on the circuit board which can also function as a heat sink. As a result, the ground lead is a more efficient heat dissipator than the other non-grounded leads. The second embodiment takes advantage of this by making the surface area of the inner ground lead portion at least twice that of the other inner lead portions so that more heat is conducted into the ground lead.

In contrast to some of the prior thermally enhanced leadframe structures, the present leadframe structure utilizes the existing leads of a leadframe to conduct heat away from the IC. Since the number of leads are not increased, the thermally efficient leadframe structure can be incorporated into existing IC package designs without increasing the size of the IC package. In addition, existing IC package designs that utilize the present leadframe structure can accomodate larger ICs than before because the present leadframe structure has no leadframe paddle to limit the IC size.

Unlike some of the prior thermally enhanced leadframes, the present leadframe structure does not require additional thermally conductive components, such as thermally conductive sheets. As a result, additional manufacturing steps and tools are not required.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
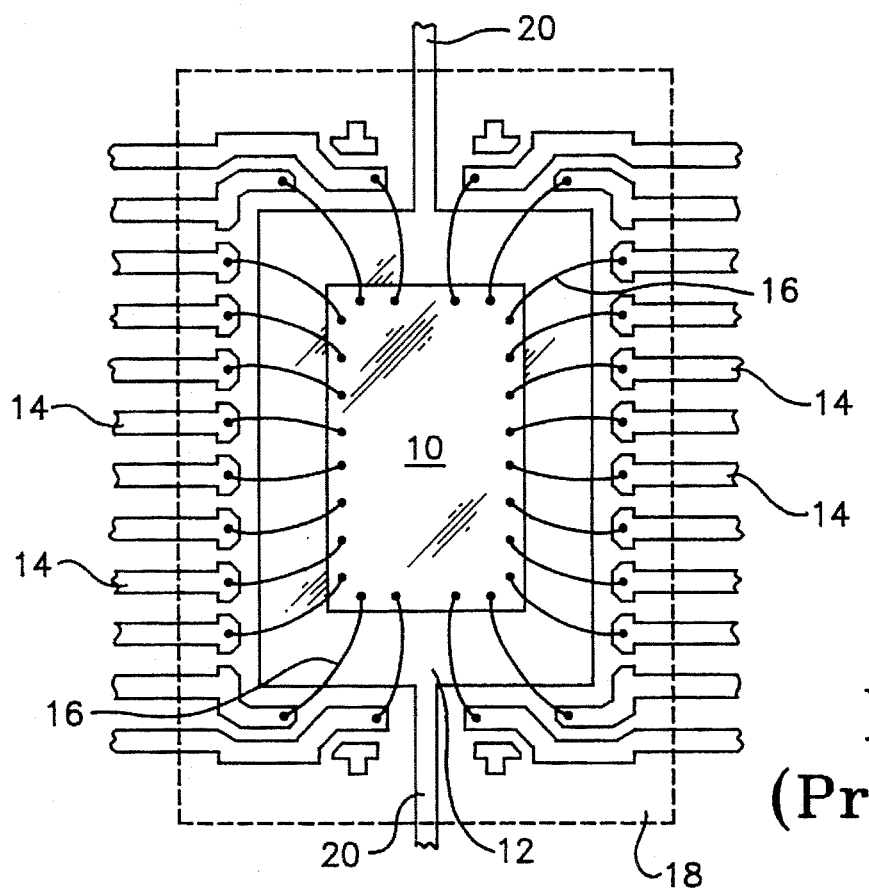
FIG. 1, described above, is a sectional view of an IC package incorporating a prior leadframe structure.
Figure 2:
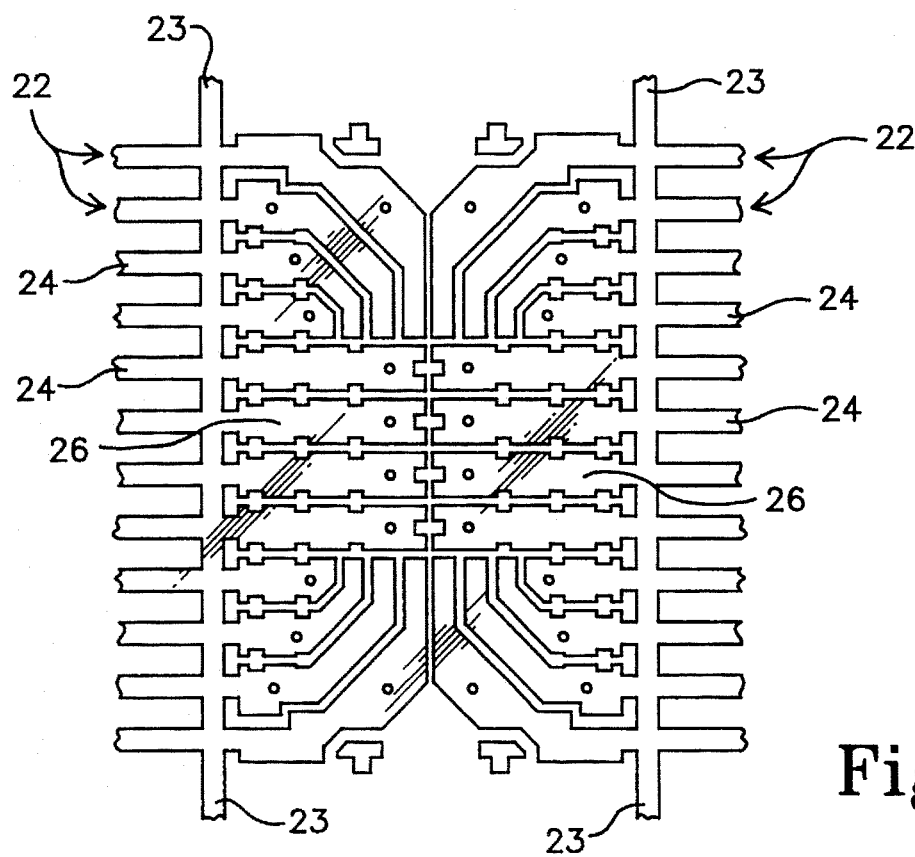
FIG. 2 is a plan view of the thermally enhanced leadframe structure of the present invention.

FIG. 2 illustrates the thermally enhanced leadframe structure of the present invention. The leadframe generally consists of leads 22 that are held in position with tie-bars 23. The leadframe is preferably made from electrically and thermally conductive material, such as copper.

The widths of the outer lead portions 24 are typically between approximately 0.33 and 0.51 mm, with an approximate center-to-center spacing of 1.27 mm. These are the standard outer widths and spacings generally used in leadframes. Prior leadframes that utilize their leads to support the IC typically have uniform width leads.

In contrast, at least some of the inner lead portions 26 of the present leadframe structure are wider than their respective outer lead portions 24. In the preferred embodiment, the widths of the wider inner lead portions 26 are between approximately 1.07 and 1.14 mm. The center-to-center spacing of all the inner lead portions is preferably, but not necessarily, the same as that of the outer lead portions 24.

The widths of the inner lead portions 26 are controlled by making the gaps between them as small as the manufacturing process will allow, while maintaining electrical isolation. If the leadframe is manufactured with standard chemical etching techniques, the gap can be generally as small as the leadframe is thick, typically between 0.127 and 0.203 mm.

Figure 3:
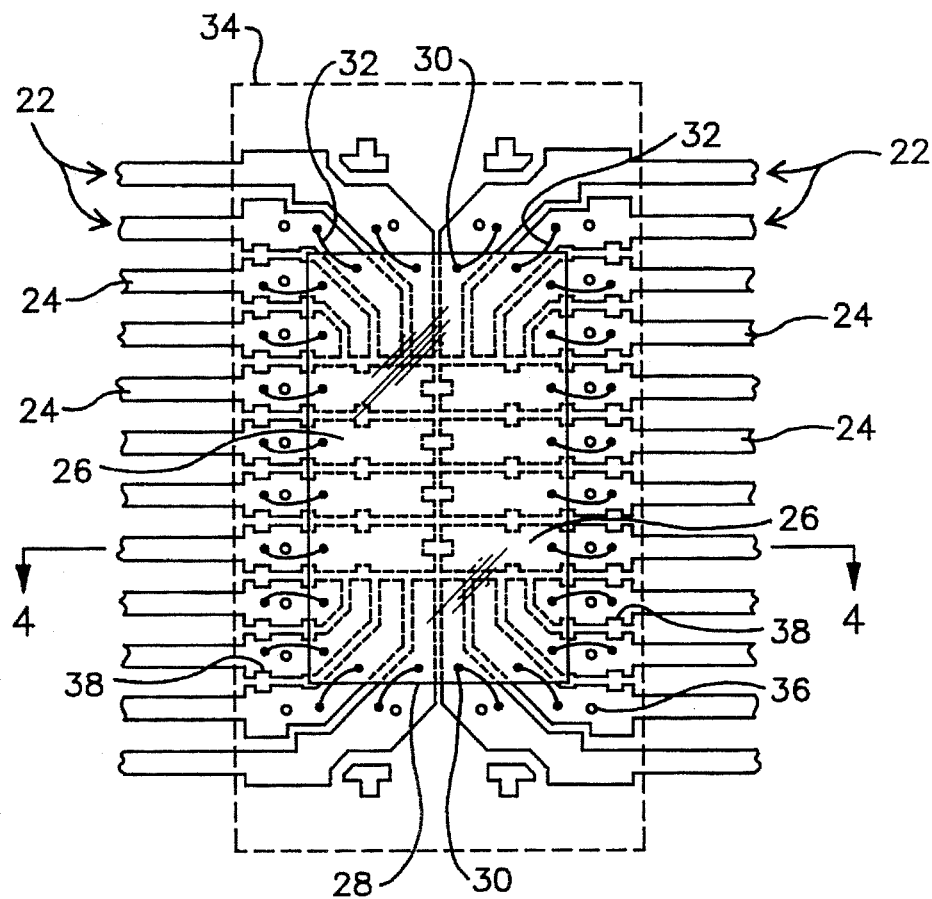
FIG. 3 is a plan view of an IC package incorporating the invention.

FIG. 3 illustrates an IC package with the thermally enhanced leadframe structure of FIG. 2. The leads 22 extend underneath and support an IC 28, and are electrically connected to bonding pads 30 on the IC 228 with wire bonds 32. The IC 228 and the inner lead portions 226 are encapsulated in a moulding compound 34, such as Sumitomo EME 6300H moulding compound.

The wider inner lead portions 26 result in a larger thermal contact area between them and the IC 28, which increases the amount of heat conducted away from the IC 28.

In the preferred embodiment, the inner lead portions 26 contain perforations 36 and indentations 38. The moulding compound 34 flows through the perforations 36 and into the indentations 38, thereby securely anchoring the leads 22 in the moulding compound 34.

After the leadframe and IC 28 have been encapsulated in the moulding compound 34, the tie bars (element 23 in FIG. 2) are cut so that the leads 22 are electrically isolated from each other. Since the leads 22 are securely anchored in the moulding compound 34, their relative positions are maintained after the tie bar is cut.

Figure 4:
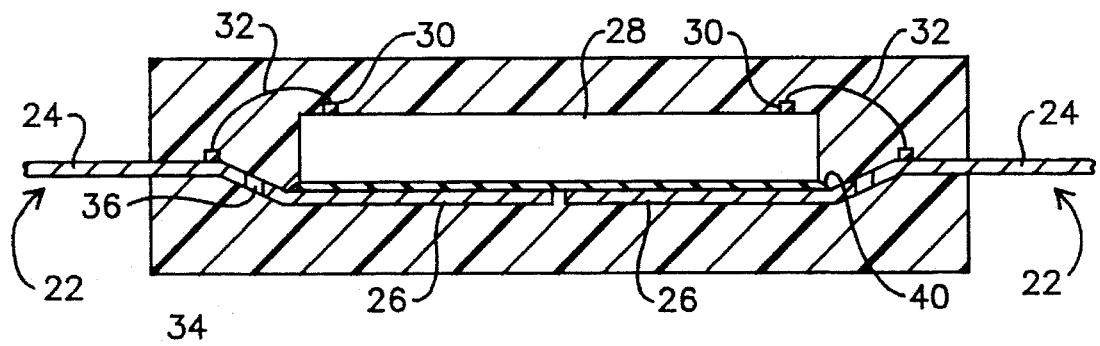
FIG. 4 is a sectional view of the embodiment of FIG. 3 taken along the section line 4—4.

FIG. 4 is a sectional view of the embodiment of FIG. 3 taken along the section line 4—4. The IC 28 is attached to the inner lead portions 26 by an electrically insulating and thermally conductive adhesive 40, such as Alpha Metals Stay Stik™ tape adhesive. An additional benefit of supporting the IC 28 with the inner lead portions 26 is the ability to accomodate wider ICs than is possible with standard leadframes. In standard leadframes, the IC is supported by a leadframe paddle and the IC width cannot be greater than the width of the paddle. The paddle width is limited because the paddle cannot be in electrical contact with the inner lead portions (there must be a space of approximately 203 to 254 microns between the inner lead portions and the leadframe paddle). Since the present leadframe does not utilize a leadframe paddle, this width limitation is not present. As a result, the present leadframe can accomodate ICs that are approximately 405 to 508 microns wider than those accomodated by standard leadframes.

In operation, heat generated by the IC 28 is transmitted to the inner lead portions 26. The large thermal contact area between the IC 28 and the inner lead portions 26 results in an efficient heat transfer between them. The heat is ultimately transmitted to the circuit board (not shown) by the leads 22.

Although the present invention utilizes the leads 22 for heat dissipation, other heat conducting paths are still present. For example, some of the heat radiated into the moulding compound 34 is conducted to the surface of the package, where it is radiated into the air.

In typical IC packages, at least one of the leads 22 is designated a ground lead and is connected to a metal ground plane on the circuit board (not shown). The metal ground plane on the circuit board also serves as an efficient heat sink because of its thermal conduction properties and the relatively large area that it typically occupies on the circuit board. As a result, the ground plane is a more efficient heat conductor than other portions of the circuit board.

Figure 5:
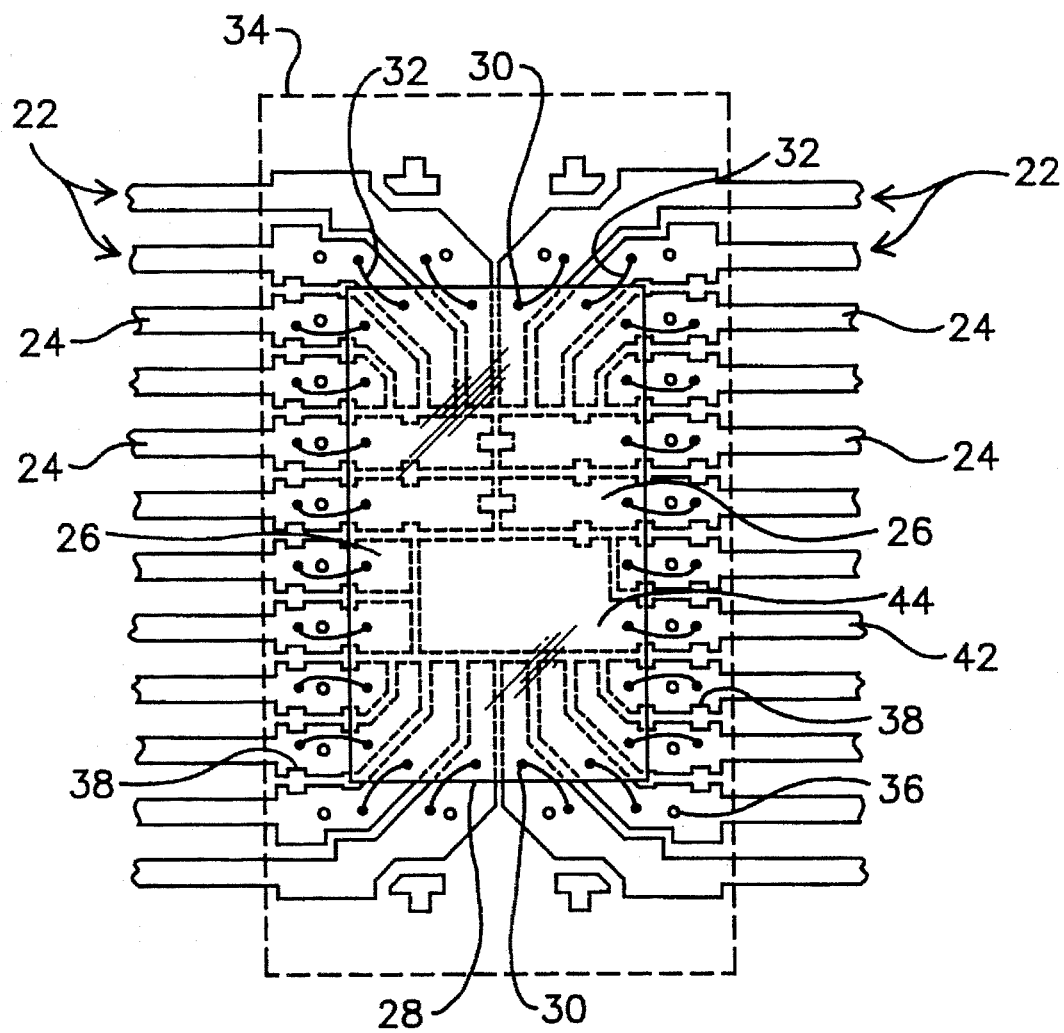
FIG. 5 is a plan view of an IC package incorporating another embodiment of the invention with an enlarged inner ground lead portion.

FIG. 5 illustrates a leadframe structure that takes advantage of the higher heat conduction properties of the ground plane. In this embodiment, the ground lead 42 is designed so that its inner portion 44 extends under a substantially larger area of the IC 28 surface than any other individual inner lead portion 26, preferably an area at least twice as large. The larger inner ground lead portion 44 results in a larger thermal contact area between the IC 28 and the ground lead 42 (which is connected to the ground plan e/heat sink on the circuit board (not shown)). Thus, this embodiment takes advantage of the more efficient heat conduction path provided by the ground lead/ground plane combination, while still utilizing the other leads 22 in the package for heat conduction.

Numerous other variations and alternate embodiments will occur to those skilled in the art without departing from the spirit and scope of the invention. For example, although specific illustrative inner lead portion shapes are used in the drawings, other shapes may be used that cumulatively cover a substantial majority of a major IC surface. In addition, although a 24-lead package is used to illustrate the invention, the thermally enhanced leadframe structure can be implemented in any IC package. Accordingly, it is intended that the invention be limited only in terms of the appended claims.

I claim:

1. A thermally enhanced leadframe structure for supporting an integrated circuit (IC) having first, second, third and fourth lateral sides, comprising:

a plurality of electrically and thermally conductive leads with all of said leads having outer portions that are arranged on only two opposing sides of said IC, when said IC is positioned on the leadframe structure, and respective inner portions that extend along a major surface of said IC, cover a substantial majority of said IC surface and are in thermal communication with said IC surface, said plurality of leads comprising first, second, third and fourth sets of leads that initially intersect said IC at said first, second, third and fourth lateral IC sides, respectively, and at least one tie-bar for holding said leads and for maintaining their relative positions.

2. The structure of claim 1, wherein said inner lead portions cover at least 80 percent of said IC surface.

3. The structure of claim 1, further comprising a thermally conductive and electrically insulating adhesive for securely holding said IC to said inner lead portions.

4. The structure of claim 1, wherein at least one of said leads is a ground lead with an inner lead portion that extends over a substantially larger area of said IC surface than any other individual inner lead portion.

5. The structure of claim 1, wherein the gap between adjacent inner lead portions is no greater than the thickness of said leads.

6. The structure of claim 3, wherein said adhesive comprises a thermally conductive and electrically insulating tape.

7. A thermally enhanced leadframe structure for supporting an integrated circuit (IC) having first, second, third and fourth lateral sides, comprising:

a plurality of electrically and thermally conducting leads with all of said leads having outer portions that are arranged on only two, opposing sides of said IC, when said IC is positioned on the leadframe structure, and respective inner portions that extend along a major surface of said IC, are substantially wider than their respective outer portions, and are in thermal communication with said IC surface, said plurality of leads comprising first, second, third and fourth sets of leads that initially intersect said IC at said first, second, third and fourth lateral IC sides, respectively, and at least one tie-bar for holding said leads and for maintaining their relative positions.

8. The structure of claim 7, wherein said inner lead portions cover at least 80 percent of said IC surface.

9. The structure of claim 7, further comprising a thermally conductive and electrically insulating adhesive for securely holding said IC to said inner lead portions.

10. The structure of claim 7, wherein at least one of said leads is a ground lead with an inner lead portion that is substantially wider than any other individual inner lead portion.

11. The structure of claim 7, wherein the gap between adjacent inner lead portions is no greater than the thickness of said leads.

12. The structure of claim 9, wherein said adhesive comprises a thermally conductive and electrically insulating tape.

13. A thermally enhanced integrated circuit (IC) package, comprising:

an integrated circuit (IC) having first, second, third and fourth lateral sides, a plurality of electrically and thermally conductive leads with all of said leads having outer portions that are arranged on only two opposing sides of said IC package, and respective inner portions that extend along a major surface of said IC, cover a substantial majority of said IC surface and are in thermal communication with said IC surface, said leads in electrical communication with bonding pads on said IC, said plurality of leads comprising first, second, third and fourth sets of leads that initially intersect said IC at said first, second, third and fourth lateral IC sides, respectively, and a moulding compound encapsulating said IC and said inner lead portions.

14. The package of claim 13, wherein said inner lead portions cover at least 80 percent of said IC surface.

15. The package of claim 13, wherein at least some of said inner lead portions include at least one perforation, with said moulding compound extending through said perforation to more securely anchor said inner lead portions to said moulding compound.

16. The package of claim 13, wherein at least some of said inner lead portions include at least one indentation along its perimeter, with said moulding compound extending into said indentation to more securely anchor said inner lead portions to said moulding compound.

17. The package of claim 13, further comprising a thermally conductive and electrically insulating adhesive securely holding said IC to said inner lead portions.

18. The package of claim 13, wherein at least one of said leads is a ground lead with an inner lead portion that extends along a substantially larger area of said IC surface than any other individual inner lead portion.

19. The package of claim 13, wherein the gap between adjacent inner lead portions is no greater than the thickness of said leads.

20. The package of claim 17, wherein said adhesive comprises a thermally conductive and electrically insulating tape.

21. A thermally enhanced integrated circuit (IC) package, comprising:

an integrated circuit (IC) having first, second, third and fourth lateral sides, a plurality of electrically and thermally conductive leads with all of said leads having outer portions that are arranged on only two opposing sides of said IC package, and respective inner portions that extend along a major surface of said IC, are substantially wider than their respective outer portions, and are in thermal communication with said IC surface, said leads in electrical communication with bonding pads on said IC, said plurality of leads comprising first, second, third and fourth sets of leads that initially intersect said IC at said first, second third and fourth lateral IC sides, respectively, and a moulding compound encapsulating said IC and said inner lead portions.

22. The package of claim 21, wherein said inner lead portions cover at least 80 percent of said IC surface.

23. The package of claim 21, wherein at least some of said inner lead portions include at least one perforation outside of said IC, with said moulding compound extending through said perforation to more securely anchor said inner lead portions to said moulding compound.

24. The package of claim 21, wherein at least some of said inner lead portions include at least one indentation along its perimeter, with said moulding compound extending into said indentation to more securely anchor said inner lead portions to said moulding compound.

25. The package of claim 21, further comprising a thermally conductive and electrically insulating adhesive securely holding said IC to said inner lead portions.

26. The package of claim 21, wherein at least one of said leads is a ground lead with an inner lead portion that is substantially wider than any other individual inner lead portion.

27. The package of claim 21, wherein the gap between adjacent inner lead portions is no greater than the thickness of said leads.

28. The package of claim 25, wherein said adhesive comprises a thermally conductive and electrically insulating tape.

* * * * *